United States Patent
Foo et al.

(10) Patent No.: US 11,460,526 B1
(45) Date of Patent: Oct. 4, 2022

(54) PULSE SEQUENCE GENERATION SYSTEMS AND METHODS OF REDUCING ACOUSTIC NOISE IN MAGNETIC RESONANCE SYSTEMS

(71) Applicant: GE PRECISION HEALTHCARE LLC, Wauwatosa, WI (US)

(72) Inventors: Thomas Kwok-Fah Foo, Clifton Park, NY (US); Matthew Richard Tarasek, Niskayuna, NY (US); Desmond Teck Beng Yeo, Clifton Park, NY (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 14 days.

(21) Appl. No.: 17/244,237

(22) Filed: Apr. 29, 2021

(51) Int. Cl.
*G01R 33/385* (2006.01)
*G01R 33/561* (2006.01)

(52) U.S. Cl.
CPC ..... *G01R 33/3854* (2013.01); *G01R 33/5618* (2013.01)

(58) Field of Classification Search
CPC .................. G01R 33/3854; G01R 33/5618
See application file for complete search history.

(56) References Cited

U.S. PATENT DOCUMENTS

2015/0123661 A1* 5/2015 Yui ..................... G01R 33/3856
324/318
2015/0177345 A1* 6/2015 Ham .................. G01R 33/3614
324/309
2015/0293191 A1* 10/2015 Paul ...................... G01R 33/483
324/309
2020/0064426 A1* 2/2020 Ersoz ................. G01R 33/3852

OTHER PUBLICATIONS

Farzaneh F, Riederer SJ, Pelc NJ. Analysis of T2 Limitations and Off-Resonance Effects on Spatial Resolution and Artifacts in Echo-Planar Imaging. Magn Reson Med. 1990; 14:123-39. [PubMed: 2352469].
Heismann B, Ott M, Grodzki D. Sequence-Based Acoustic Noise Reduction of Clinical MRI Scans. Magn Reson Med. 2015; 73(3):1104-9. [PubMed:24889327].

(Continued)

*Primary Examiner* — Susan S Lee
(74) *Attorney, Agent, or Firm* — Armstrong Teasdale LLP

(57) ABSTRACT

A pulse sequence generation computing device for a magnetic resonance imaging (MRI) system includes a processor in communication with a memory device. The processor is programmed to receive a pulse sequence including a plurality of gradient pulses and provide a pulse sequence threshold function corresponding to an acoustic noise reduction level. For each gradient pulse in the pulse sequence, the processor is programmed to determine an amplitude and a slew rate of the gradient pulse, determine a threshold amplitude and slew rate of the gradient pulse, and compare the determined amplitude and slew rate to the threshold amplitude and slew rate. If either the determined amplitude or slew rate exceeds the threshold amplitude or slew rate, the processor adjusts at least one of the amplitude and the slew rate of the gradient pulse to an amplitude and a slew rate as defined by the pulse sequence threshold function.

20 Claims, 7 Drawing Sheets

(56) References Cited

OTHER PUBLICATIONS

Hennel F, Girard F, LoennekerT. "Silent" MRI With Soft Gradient Pulses. Magn Reson Med. 1999; 42(1):6-10. [PubMed: 10398943].
Hennel F. Fast Spin Echo and Fast Gradient Echo MRI With Low Acoustic Noise. J Magn Reson Imaging. 2001; 13(6):960-6. [PubMed: 11382960].
Idiyatullin D, Corum C, Park J-Y, Garwood M. Fast and quiet MRI using a swept radiofrequency. J Magn Reson. 2006; 181(2):342-349. [PubMed:16782371 ].
Madio DP, Lowe IJ. Ultra-Fast Imaging Using Low Flip Angles and FIDs. Magn Reson Med. 1995; 34:525-529. [PubMed: 8524019].
Segbers M, Rizzo Sierra CV, Duifhuis H, Hoogduin JM. Shaping and Timing Gradient Pulses to Reduce MRI Acoustic Noise. Magn Reson Med. 2010; 64(2):546-53. [PubMed: 20665798].
Tan ET, Hardy CJ, Shu Y, In MH, Guidon A, Huston J 3rd, Bernstein MA, Foo TKF. Reduced Acoustic Noise in Diffusion Tensor Imaging on a Compact MRI System. Magn Reson Med 2018; 79: 2902-11. [PMID: 28971512].
Weiger M, Brunner DO, Dietrich DE, Mueller CF, Pruessmann KP. ZTE Imaging in Humans. Magn Reson Med. 2013; 70:328-332. [PubMed: 23776142].

\* cited by examiner

PULSE SEQUENCE GENERATION SYSTEMS AND METHODS OF REDUCING ACOUSTIC NOISE IN MAGNETIC RESONANCE SYSTEMS

STATEMENT REGARDING FEDERALLY SPONSORED RESEARCH & DEVELOPMENT

This disclosure was made with Government support under contract number W81XWH-16-2-0054 awarded by the Department of Defense under the Congressionally Directed Medical Research Programs. The Government has certain rights in the invention

BACKGROUND

The field of the disclosure relates generally to systems and methods of generating pulse sequences in magnetic resonance (MR) systems, and more particularly, to systems and methods of reducing acoustic noise in MR systems.

MR imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

In MR imaging, acoustic noise impacts patient and operator safety. Acoustic noise results from Lorenz forces between the main magnetic field and conductors carrying time-varying electric current in the gradient system. The interaction causes vibrations that generate sound pressure waves, which could be harmful if not controlled or mitigated.

BRIEF DESCRIPTION

In one aspect, a pulse sequence generation computing device for a magnetic resonance imaging (MRI) system is provided. The pulse sequence generation computing device includes at least one processor in communication with at least one memory device. The at least one processor is programmed to receive a pulse sequence including a plurality of gradient pulses and provide a pulse sequence threshold function that corresponds to an acoustic noise reduction level of acoustic noise produced by switching gradients in the MRI system. The pulse sequence threshold function indicating a plurality of threshold amplitudes of the gradient pulses and a plurality of threshold slew rates of the gradient pulses each associated with one of the plurality of threshold amplitudes. For each gradient pulse in the pulse sequence, the at least one processor is further programmed to determine an amplitude of the gradient pulse and a slew rate of the gradient pulse, determine a threshold amplitude corresponding to the determined slew rate and a threshold slew rate corresponding to the determined amplitude, compare the determined amplitude to the threshold amplitude and the determined slew rate to the threshold slew rate, and if the determined amplitude exceeds the amplitude threshold or the determined slew rate exceeds the slew rate threshold, the at least one processor is further configured to modify the gradient pulse by adjusting at least one of the amplitude and the slew rate of the gradient pulse to an amplitude and a slew rate as defined by the pulse sequence threshold function.

In another aspect, a computer implemented method of generating a pulse sequence in a magnetic resonance imaging (MRI) system is provided. The method includes receiving a pulse sequence including a plurality of gradient pulses and providing a pulse sequence threshold function that corresponds to an acoustic noise reduction level of acoustic noise produced by switching gradients in the MRI system. The pulse sequence threshold function indicates a plurality of threshold amplitudes of the gradient pulses and a plurality of threshold slew rates of the gradient pulses each associated with one of the plurality of threshold amplitudes. The method further includes, for each gradient pulse in the pulse sequence, determining an amplitude of the gradient pulse and a slew rate of the gradient pulse, determining a threshold amplitude corresponding to the determined slew rate and a threshold slew rate corresponding to the determined amplitude, comparing the determined amplitude to the threshold amplitude and the determined slew rate to the threshold slew rate, and modifying, if the determined amplitude exceeds the amplitude threshold or the determined slew rate exceeds the slew rate threshold, the gradient pulse by adjusting at least one of the amplitude and the slew rate of the gradient pulse to an amplitude and a slew rate as defined by the pulse sequence threshold function. The method further includes causing the modified pulse sequence to be generated by the MRI system.

In yet another aspect, a pulse sequence generation computing device for a magnetic resonance imaging (MRI) system is provided. The pulse sequence generation computing device includes at least one processor in communication with at least one memory device. The at least one processor is programmed to receive a pulse sequence including a plurality of gradient pulses and provide a pulse sequence threshold function that corresponds to an acoustic noise reduction level of acoustic noise produced by switching gradients in the MRI system. The pulse sequence threshold function indicating a plurality of threshold amplitudes of the gradient pulses and a plurality of threshold slew rates of the gradient pulses each associated with one of the plurality of threshold amplitudes. For at least one gradient pulse in the pulse sequence, the at least one processor is further programmed to determine an amplitude of the gradient pulse and a slew rate of the gradient pulse, determine a threshold amplitude corresponding to the determined slew rate and a threshold slew rate corresponding to the determined amplitude, compare the determined amplitude to the threshold amplitude and the determined slew rate to the threshold slew rate, and if the determined amplitude exceeds the amplitude threshold or the determined slew rate exceeds the slew rate threshold, the at least one processor is further configured to modify the gradient pulse by adjusting at least one of the amplitude and the slew rate of the gradient pulse to an amplitude and a slew rate as defined by the pulse sequence threshold function.

DRAWINGS

DETAILED DESCRIPTION

Figure 1:
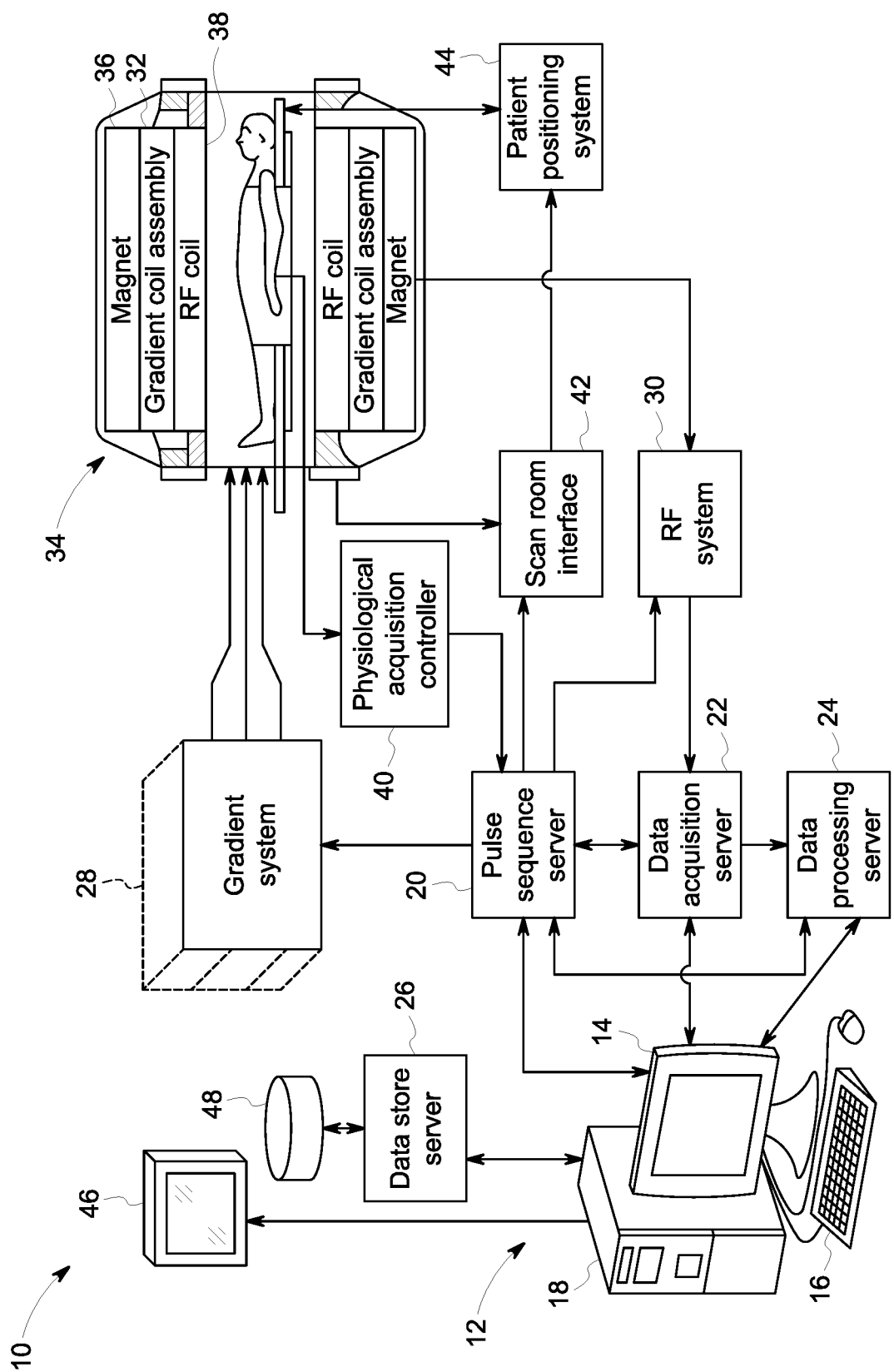
FIG. 1 is a schematic diagram of an exemplary magnetic resonance imaging (MRI) system.

The disclosure includes systems and methods of generating pulse sequences in a magnetic resonance (MR) system using a pulse sequence threshold function that can be adjusted using configuration variables. The pulse sequence threshold function indicates a plurality of threshold gradient amplitudes of the gradient pulses and a plurality of threshold slew rates of the gradient pulses or waveforms, that are each associated with one of the plurality of threshold gradient amplitudes. The systems and methods disclosed herein provide for acoustic noise reduction in the MR system by tailoring the derating of gradient pulse or waveform characteristics, such as pulse amplitude and slew rate, to the pulse characteristics of individual pulses or waveforms according to the pulse sequence threshold functions. As opposed to general derating, in which static pulse characteristic thresholds are set globally, the use of the pulse sequence threshold functions allows for an active or dynamic derating scheme, where a plurality of thresholds may be provided and selected for any individual pulse or waveform to provide for desirable pulse or waveform characteristics and a desired acoustic noise reduction level in the MR system. As such, each pulse or waveform or a plurality of pulses or waveforms are individually adjusted according to a threshold function, with each pulse or waveform, or a set of pulses or waveforms having different characteristics of gradient pulse or waveform rise time and amplitude. The gradient pulse or waveform rise time and amplitude values conform to the threshold function. MR imaging (MRI) pulse sequence is illustrated as an example. The systems and methods described herein may also be applied to other MR pulse sequences such as pulse sequences for MR spectroscopy. Method aspects will be in part apparent and in part explicitly discussed in the following description.

In magnetic resonance imaging (MRI), a subject is placed in a magnet. As used herein, a subject is a human, animal, phantom, or any object scanned by the MR system. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as BO and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses or waveforms (used interchangeably herein) are used to scan through the k-space, the space of spatial frequencies or inverse of distances. A Fourier relationship exists between the acquired MR signals and an image of the subject, and therefore the image of the subject can be derived by reconstructing the MR signals.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency (RF) system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses or waveforms may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \quad (1);$$

and the phase of the received MR signal may also be determined as in Eq. (2) below:

$$\varphi = \tan^{-1}\left(\frac{Q}{I}\right). \quad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the performance of a back projection image reconstruction of acquired MR data, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

Figure 2:
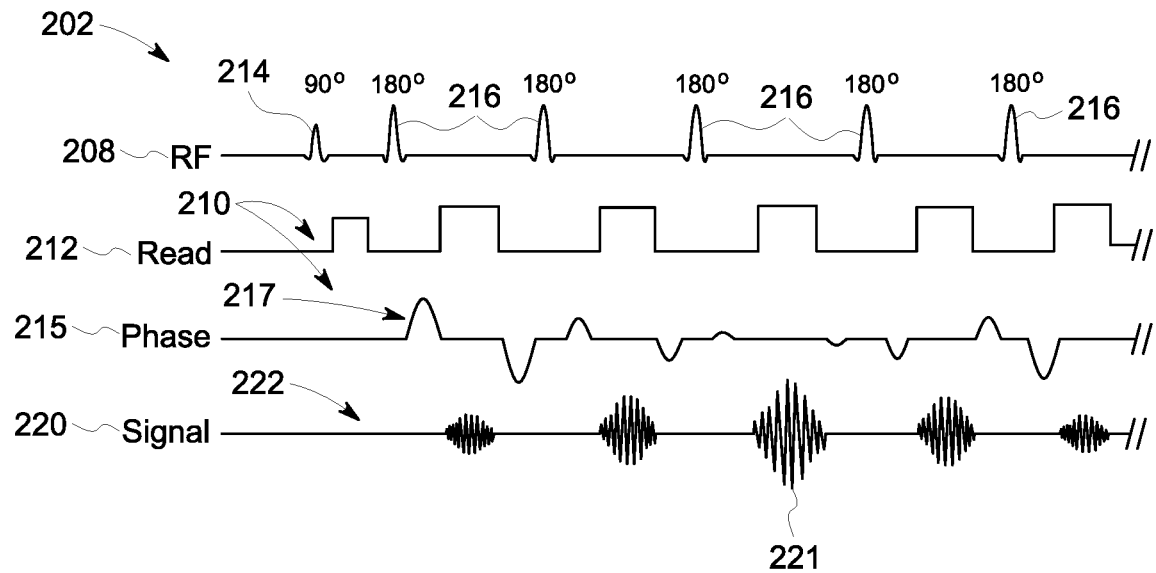
FIG. 2 is an exemplary pulse sequence for use with the MRI system shown in FIG. 1.

FIG. 2 is a pulse sequence diagram of a fast spin echo sequence 202. The fast spin echo sequence 202 includes RF pulses or waveforms 208 and gradient pulses or waveforms 210. Gradient pulses 210 may be along the read-out direction 212 or phase-encoding direction 215. Gradient pulses 210 may be along a slice-encoding direction (not shown) or a second phase-encoding direction (not shown) in a three-dimensional (3D) pulse sequence. A diagram of the fast spin echo sequence 202 may also show MR signals in the signal channel 220. In the fast spin echo sequence 202, the RF pulses 208 include an excitation pulse 214 and a plurality of refocusing pulses 216. The excitation pulse 214 excites and rotates magnetization relative to the x-y plane. The refocusing pulses 216 refocus the magnetization that has dephased such that echoes 221 are formed. The signal channel 220 includes a series of echoes 221, or an echo train 222. The k-space locations of the echoes in the ky direction or phase-encoding direction are determined by the phase-encoding gradients 217. The time between the repetitions of the pulse sequence 202 is referred to as a repetition time (TR). The number of echoes in one TR of the fast spin echo sequence 202 is referred to as an echo train length (ETL). The ETL may be any number between two and the image matrix size in the phase-encoding direction. In operation, a slice in the subject is selected and excited by the excitation pulse 214, and refocused by the refocusing pulses 216. The k space is scanned by varying gradient pulses 210. Echoes 221 of an ETL corresponding to a plurality of ky lines in the k space are acquired in one TR. The sequence 202 is repeated to scan through the k space to acquire MR signals at other ky lines. The MR signals are used to reconstruct MR images.

Figure 3:
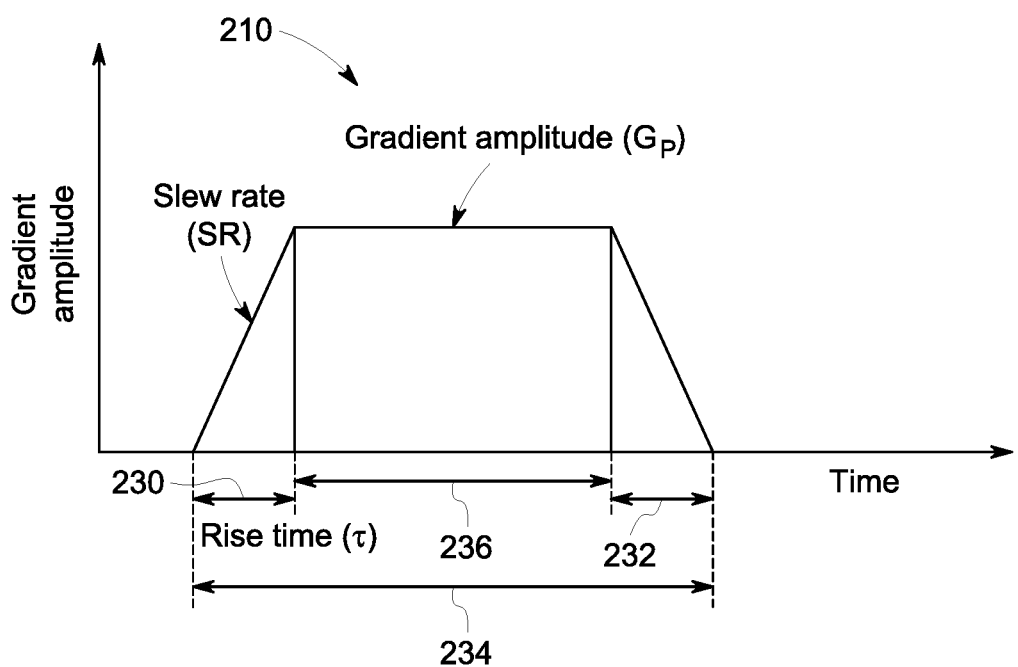
FIG. 3 is an exemplary gradient pulse of the pulse sequence shown in FIG. 2.

FIG. 3 is a schematic diagram of an exemplary gradient pulse 210. While shown schematically in FIG. 2 as rectangular in the read-out direction, as shown in FIG. 3, the gradient pulse 210 has a generally trapezoidal shape because of a finite slew rate of the MRI system. In particular, the gradient pulse 210 has a gradient amplitude ($G_p$), typically measured in milli-Tesla per meter (mT/m) or Gauss per centimeter (G/cm). The integral of the gradient amplitude over the total pulse width 234 of the gradient pulse is proportional to the k space location sampled by the gradient pulse 210. In MRI, k-space is sampled by varying the gradient pulses 210 in the read-out direction 212 and the phase-encoding direction 215, where the read-out direction corresponds to kx, the phase-encoding direction corresponds to ky, and a second phase-encoding direction corresponds to kz. The spatial resolution of the MRI image in x, y, z directions determines the maximum kx, ky, or kz, respectively. That is, the spatial resolution determines the maximum value of the integral of the gradient pulse 210 over the duration 234. Therefore, to reach a desired spatial resolution, the amplitude $G_p$ of the gradient pulse 210 and/or the duration 234 of the gradient pulse 210 may be adjusted. The amplitude $G_p$ of the gradient pulse 210 is limited by the peak or maximum gradient amplitude of the scanner 10 system's gradient amplifier capability, as well as the gradient maximum slew rate. Superconducting whole-body scanners may have maximum gradient strengths in the range of 20-100 mT/m. This includes magnets with field strengths of up to and beyond 7.0 Tesla (T), where typical whole-body MRI scanners operate in the 0.5 T to 3.0 T range.

Due to the finite slew rate, the gradient pulse 210 does not reach its desired amplitude $G_p$ instantaneously and is limited by the maximum voltage that can be supplied by a gradient amplifier (not shown) of the gradient system 28. Besides the plateau section 236, the gradient pulse 210 therefore also includes a ramp-up portion (rise time) 230, in which the gradient pulses 210 rises to the gradient amplitude $G_p$ and a ramp-down portion (fall time) 232, in which the gradient pulse falls from the gradient amplitude $G_p$. The gradient pulse 210 may appear as in a blipped shape, as shown for example with respect to the phase-encoding gradients 217, where the plateau section 236 is small. A rise time (t), typically measured in seconds, of the gradient pulse 210 is shown as the amount of time to complete the ramp-up portion, for the gradient pulse 210 to reach the gradient amplitude ($G_p$). The gradient waveform 210 duration at the plateau section 236 may also referred to as the gradient pulse width. The gradient total pulse width 234 includes the duration of constant amplitude 236 plus the ramp up portion 230 and ramp down portion 232. It is common that that rise and fall times 230, 232 for a gradient pulse or waveform are of the same value. A slew rate (SR) of the gradient pulse 210, typically measured in Tesla per meter per second (T/m/s) is shown as the slope of the gradient pulse 210 over the rise time (t) period. The slew rate (SR) of the gradient pulse 210 is equal to the gradient amplitude ($G_p$) divided by the rise time (t). That is, the slew rate (SR) is inversely proportional to the rise time (t). The faster the slew rate (SR), the shorter the rise time (τ). A faster slew rate (SR) therefore shortens the duration 234 of the gradient pulse 210, for a given amplitude ($G_p$) of the gradient pulse 210. The maximum available slew rate (SR) of the gradient pulse 210 is limited by the slew rate specifications of the scanner (i.e., the maximum voltage that can be supplied by a gradient amplifier). For example, scanners with a high slew rate allow for fast switching between gradient pulses with high amplitudes. In designing a pulse sequence, the slew rate (SR) for all gradient pulses 210 in the pulse sequence may be the same. Alternatively, the slew rate (SR) may be adjusted individually for each gradient pulse 210, but cannot exceed the maximum slew rate (SR).

Referring to FIG. 1, during operation, providing an electrical signal to current carrying conductors in the gradient coil assembly 32 may induce Lorenz forces in the magnet assembly 34, which in turn generate sound pressure waves that create an acoustic noise within the magnet assembly 34 and the gradient coil assembly 32. In particular, the Lorentz forces and resulting acoustic noise are generated by switching gradient pulses 210 in the gradient coil assembly 32 and propagated throughout the magnet assembly 34. Acoustic noise in MRI impacts patient and operator safety of MRI and is one of the main categories considered by the United States Food and Drug Administration (FDA) for significant risk of clinical MR systems. The FDA mandates acoustic noise limits for nonsignificant risk operation as A-weighted root mean squared (r.m.s.) sound pressure levels being less than or equal to 99 A-weighted decibels (dBA) equivalent continuous sound level (LAeq) with hearing protection in place, and less than or equal to 140 decibels (dB) unweighted peak sound level (Lpeak). Even with hearing protection in place, acoustic noise is a major source of patient discomfort that increases with magnetic field strength affecting both adult and pediatric populations especially at 3.0 T and above. Furthermore, acoustic noise from the gradients impedes communication between the patient and the scan operator. Acoustic noise is an important issue in some brain imaging, and in particular has been shown to influence results of functional MRI (fMRI) studies. In addition, quiet or silent MRI has distinct advantages when studying pediatric populations, especially for assessing brain function or brain development, and also assessing the effects of sleep on brain function.

Brain MRI frequently employs echo-planar imaging (EPI) pulse sequence, which benefits from acoustic noise reduction. EPI typically employs a train of trapezoidal readout and phase encoding gradient pulses with short echo spacing. Data are acquired at high readout bandwidth (61.25 to 500 kHz), and EPI pulse sequences tend to have higher acoustic noise than their counterparts in standard imaging. Fast gradient switching and high gradient amplitudes, characteristic of EPI, are primary reasons for the high level of acoustic noise in fMRI and in diffusion imaging of the brain, both of which often uses an EPI pulse sequence.

Referring to FIG. 3, the total level of acoustic noise is influenced by both the gradient amplitude ($G_p$) and the rise time (t) of the gradient pulses 210 with higher acoustic noise levels being associated with at least one of a greater gradient amplitude ($G_p$) and shorter rise time (t) of the gradient pulses 210. For example, fast gradient switching and high gradient amplitudes in echo-planar imaging, are primary reasons for the high level of acoustic noise in diffusion imaging and fMRI. Moreover, some superconducting MRI scanners may have peak gradient strengths that exceed the conventional range of 20-80 mT/m, with peak gradient strengths in the range of 200-400 mT/m and the ability to slew as much as 500-900 T/m/s. For such scanners, the acoustic noise levels may be limiting when operating at the maximum gradient and slew rate parameters.

To reduce acoustic noise levels in MRI systems, pulse sequence derating methods have been previously used that change the pulse characteristics of the gradient pulses in a manner that reduces the acoustic noise. For example, some derating methods have used a general derating scheme, whereby static amplitude and slew rate thresholds are set and the gradient pulses of the pulse sequence are modified to be at or below the thresholds. Such methods may change the pulse sequence to lower the amplitudes of any gradients in the pulse sequence that exceed the threshold amplitude and/or lower the slew rates of any gradients in the pulse sequence that exceed the threshold slew rate. Since these methods do not account for the combined effect of slew rate and amplitude on the acoustic noise level, use of the static thresholds may result in unnecessarily increased gradient rise time and reduced phase-encoding bandwidth for all imaging sequences and all applications, and thereby resulting in a decreased MRI performance. In addition, global derating methods affects MRI image quality by increasing echo time (TE) as well as the overall MRI repetition time (TR).

Some methods to reduce acoustic noise levels in MRI systems have included the use of specialized gradient waveforms. For example, specialized pulse sequences that minimize gradient waveform amplitude changes or ramps have been previously been used that employ three-dimensional radial k-space trajectories and high-bandwidth or frequency-swept RF excitation. In addition, shaped rather than linear gradient ramps or rise/fall times have also been employed. In some such methods, gently-stepped or slowly-varying gradients pulses are used for noise reduction. However, these specialized pulse sequences may have a limited range of image contrast and capability and temporal resolution, rendering them infeasible for certain MRI applications, such as functional MRI and diffusion weighted imaging. For example, scanning with three-dimensional radial k-space trajectories takes much longer to scan through the k-space compared to an EPI pulse sequence for example. Specialized pulse sequences may encounter image reconstruction issues. Further, generation of frequency-swept RF-excitation also requires additional hardware and software to generate the specialized sequences.

Using targeted derating of gradient pulses, according to the pulse sequence threshold functions described herein, to achieve acoustic noise reduction and/or a desired acoustic noise level, provides improved overall MRI performance compared with prior derating systems and methods. In particular, the pulse sequence threshold functions allow for derating of individual gradient pulses using a plurality of threshold combinations for both the amplitude and slew rate of gradient pulses. In contrast with general derating methods that utilize static thresholds, the disclosed methods allow for selective modification of the slew rate and/or amplitude based on a range of the potential threshold combinations that are associated with an acoustic noise level. In one example, acoustic noise levels may be reduced in MR scanners by modifying the gradient slew rate to be at a threshold slew rate that is associated with the gradient amplitude, while maintaining the gradient amplitude. That is the gradient rise time or slew rate varies as a function of the gradient pulse amplitude. This operation is especially well suited for functional imaging and diffusion-weighted imaging where an EPI sequence is used and where general derating methods tend to aggravate image distortions in echo planar readout sequences, which are typically used in brain imaging. Furthermore, in diffusion-weighted imaging, the diffusion encoding gradients are at maximum amplitude, while the EPI readout trapezoid gradient pulse train may be at between 30-50 mT/m. As such, it is inefficient to enforce a global slew rate but rather it is better to adjust or set the slew rate for each gradient waveform as a function of the gradient amplitude desired to maximize the efficiency of the MRI pulse sequence.

The method also allows for achieving acoustic noise reductions in different pulse sequences for different clinical applications, without the use of specialized pulse sequences. For example, for sleep studies, the acoustic noise level should be relatively low, such as 70-80 dB. The gradient pulses for an EPI pulse sequence are derated based on the threshold function corresponding to this target acoustic noise level. For applications where the acoustic noise level can be at a higher level, the gradient pulses for the EPI pulse sequence may not be derated or may be derated based on the threshold function corresponding to a higher acoustic level, achieving a higher pulse sequence performance level (i.e., lower TE, echo spacing, and minimum TR times).

The systems and methods described herein may also be used to reduce eddy current effects and reduce the onset of peripheral nerve stimulation (PNS). For example, the magnitude of eddy currents generated in a conductor is influenced by the rate of change of the inciting magnetic field. As a result, fast imaging sequences where gradients are pulsed on and off quickly produce the largest and most severe eddy current problems. Other sequences that may be most affected by eddy-currents include diffusion-weighted imaging, MR spectroscopy, and any sequence with a very short TE. Peripheral nerve stimulation refers to the excitation of nerves in the extremities from electrical voltage potentials induced by rapidly changing magnetic gradients. When mild, peripheral nerve stimulation may be perceived as a slight sensation, often surprising the patient but presenting no real discomfort or physical danger. As stimulation intensity increases, motor nerve depolarization produces progressively severe and painful muscle fasciculations/contractions. Peripheral nerve stimulation also typically occurs in pulse sequences using rapid gradient switching, such as echo planar imaging. In other words, both eddy currents and peripheral nerve stimulation are generally influenced by the speed of gradient switching and gradient amplitudes. As a result, the derating methods described herein, while reducing acoustic noise levels, also may be used to alleviate peripheral nerve stimulation and eddy currents resulting from the pulse sequence and/or provide operating thresholds based on consideration for peripheral nerve stimulation and eddy currents.

Figure 4:
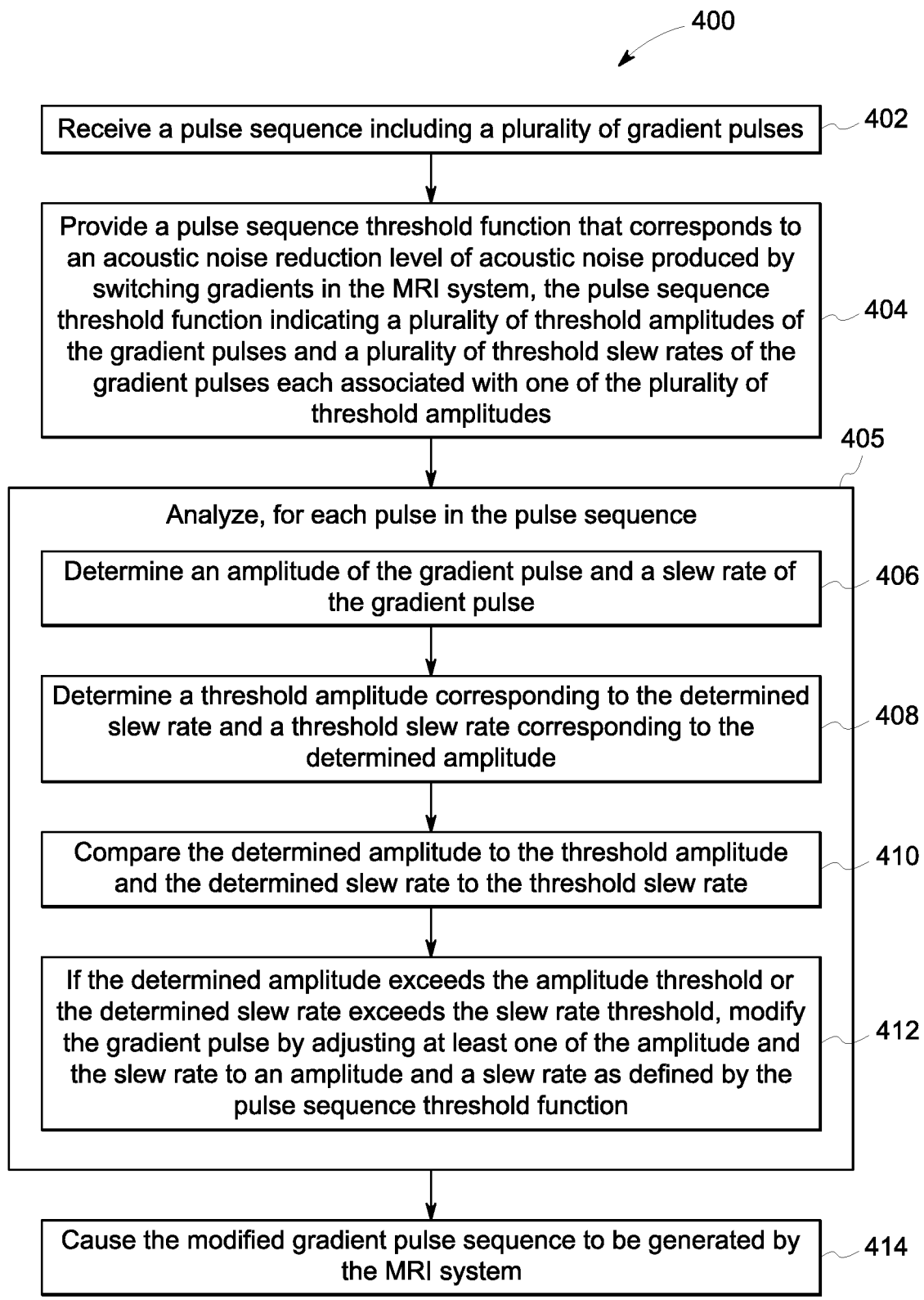
FIG. 4 is a flow chart of an exemplary method of generating a pulse sequence.
Figure 5:
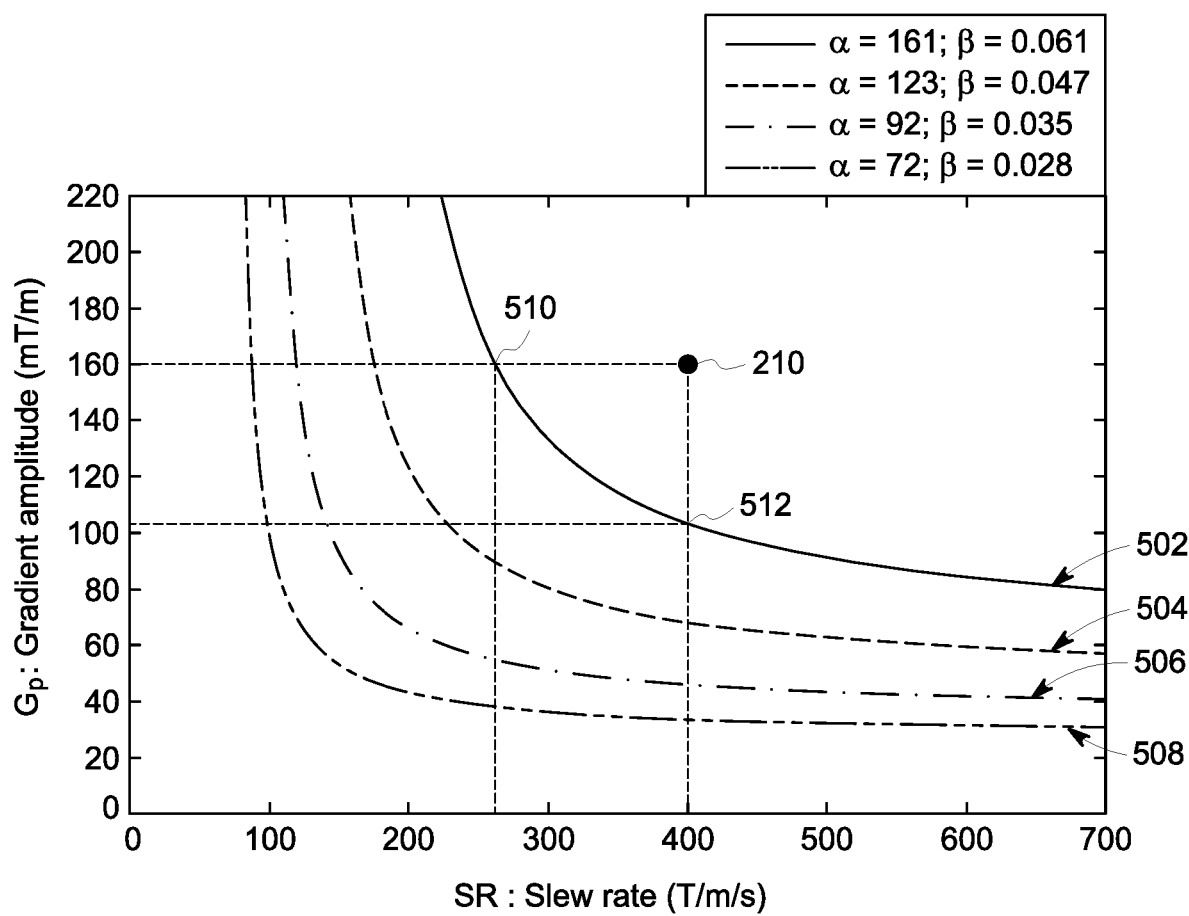
FIG. 5 is a plot showing exemplary pulse sequence threshold functions for use in the method shown in FIG. 4.

FIG. 4 is a flow chart of an exemplary method 400 of generating a pulse sequence. FIG. 5 is a schematic diagram showing pulse sequence threshold functions 502-508 for use in the method shown in shown in FIG. 4. The exemplary method 400 described herein is implemented on a computing device, which may include at least one of the pulse sequence server 20, the workstation 12, and any other computing device in communication with the pulse sequence server 20, the workstation 12, or the gradient system 28 (shown in FIG. 1).

The method 400 includes receiving 402 a pulse sequence 202 including a plurality of gradient pulses 210 (shown in FIG. 2). In particular, the pulse sequence 202 is received in the form of instructions to generate the pulse sequence 202 in the magnet assembly 34. The instructions for the pulse sequence 202 are received at the computing device in communication with at least one of the pulse sequence server 20 and the workstation 12. Though discussed herein with respect to the fast spin echo pulse sequence 202, it should be understood that the exemplary method 400 may be used to derate any suitable pulse sequence used in an MRI system.

The method 400 also includes, providing 404 a pulse sequence threshold function 502-508 that corresponds to an acoustic noise reduction level of acoustic noise produced by switching gradients in the MRI system. Referring to FIG. 5, four pulse sequence threshold functions 502-508 are shown as curves on a graph indicating a gradient amplitude along the Y-axis and a slew rate along the X-axis. The pulse sequence threshold functions 502-508 (also referred to with respect to FIG. 5 as "threshold curves) each indicate a plurality of threshold maximum amplitudes of the gradient pulses and a plurality of threshold slew rates of the gradient pulses that are each associated with one of the plurality of threshold gradient amplitudes. In other words, the threshold curves 502-508 may be used to determine a threshold gradient amplitude of a gradient pulse based on a given slew rate and/or a threshold slew rate of a gradient pulse based on a given gradient amplitude of the gradient pulse. For example, in FIG. 5, a first threshold curve 502 indicates threshold gradient amplitudes and associated threshold slew rates that are positioned along the first threshold curve 502. Moreover, each of the pulse sequence threshold functions 502-508 is associated with an acoustic noise threshold.

In the example embodiment, threshold curves 502-508 are representative curves and are associated with a given (measured) sound pressure level for particular pulse sequences. Thus, for a particular pulse sequence that is used, the acoustic noise level will generally be constant along range of gradient pulse parameter values for any one of the curves 502-508. For example, in the example embodiment of FIG. 5, the first acoustic noise threshold for the first threshold curve 502 is about 120 dBA LAeq and a 130 dB Lpeak for an axial 3D Fast Imaging Employing Steady-state Acquisition (FIESTA) R/L sequence. Thus, gradient pulses of axial 3D FIESTA R/L sequence having slew rate and amplitude parameters along the first threshold curve 502 will be at or below the 120 dBA LAeq and 130 dB Lpeak. Moreover, the acoustic noise thresholds associated with the threshold curves 502-508 may vary depending on the particular pulse sequence used. For example, as shown below with respect to FIGS. 6 and 7, the acoustic noise level for a T2 Fast Spin Echo (FSE) sequence along the first threshold curve 502 is different from the acoustic noise level of the axial 3D FIESTA R/L sequence. In particular, the acoustic noise level for a T2 FSE sequence along the first threshold curve 502 is about 115 dBA LAeq and about 126 dB Lpeak. Thus, in some embodiments, and as described in greater detail below, the threshold curve 502-508 may be selected and/or generated based on a desired acoustic noise threshold and the particular pulse sequence to be used.

In other embodiments, the first threshold curve 502 may correspond to an average acoustic noise level for the different pulse sequences. More specifically, in such embodiments, the first acoustic noise threshold is an average acoustic noise level of gradient pulses having gradient amplitudes and slew rates along the first threshold curve 502, when used in a plurality of different pulse sequences, such as: a T2 FSE sequence, a 3D FIESTA R/L sequence, an Axial Susceptibility-weighted angiography (SWAN) R/L sequence, a Functional Magnetic Resonance Imaging (fMRI) R/L sequence, a 3D FIESTA A/P sequence, an Axial Swan A/P sequence, and an fMRI A/P sequence (collectively referred to herein as "example pulse sequences). In other words, while a gradient pulse having pulse characteristics along the first curve 502 may generate an acoustic noise level that is different from the first acoustic noise threshold when used in any single one of the example pulse sequences, the average acoustic noise level for gradient pulses along the first curve 502 for each of the different example pulse sequences will be approximately equal to the first acoustic noise threshold in such embodiments. In further alternative embodiments, the pulse sequence threshold functions 502-508 may be a maximum acoustic noise level for the example pulse sequences. For example, in some such embodiments, for each of the example pulse sequences, gradient pulses 210 having pulse characteristics along a given pulse sequence threshold function 502-508 will not generate acoustic noise greater than the associated acoustic noise threshold.

In the example embodiment, the pulse sequence threshold function is determined by providing a threshold gradient amplitude $G_p(t)$ as a linear function of the rise time (t) of a gradient pulse, having a given slope coefficient (a) and an intercept coefficient of (b), as in Eq. (3) below:

$$G_p(t)=at+b \qquad (3),$$

where $G_p(t)$ is in Tesla per meter (T/m), the rise time is in seconds, the slope coefficient (a) is in T/m/s and the intercept coefficient (b) is in T/m. The slope coefficient ($\alpha$) and intercept coefficient ($\beta$) are selected such that the acoustic noise levels of pulse sequences having a gradient amplitude less than $G_p(t)$ do not, on average for the example pulse sequences, create a level of acoustic noise that exceeds the desired acoustic noise level threshold. In other words, the pulse sequence threshold function provided by Eq. (3) provides a threshold gradient amplitude $G_p(t)$ based on a given pulse rise time (t), where the resulting acoustic noise level generated by the gradient pulse, on average for a plurality of pulse sequences, is less than or equal to the desired acoustic noise level threshold. Further changes in the threshold curves by changing slope coefficient (a) and intercept coefficient (b) parameters will result in further acoustic noise reduction as the threshold curves 502-508 are moved towards the plot origin.

Figure 6:
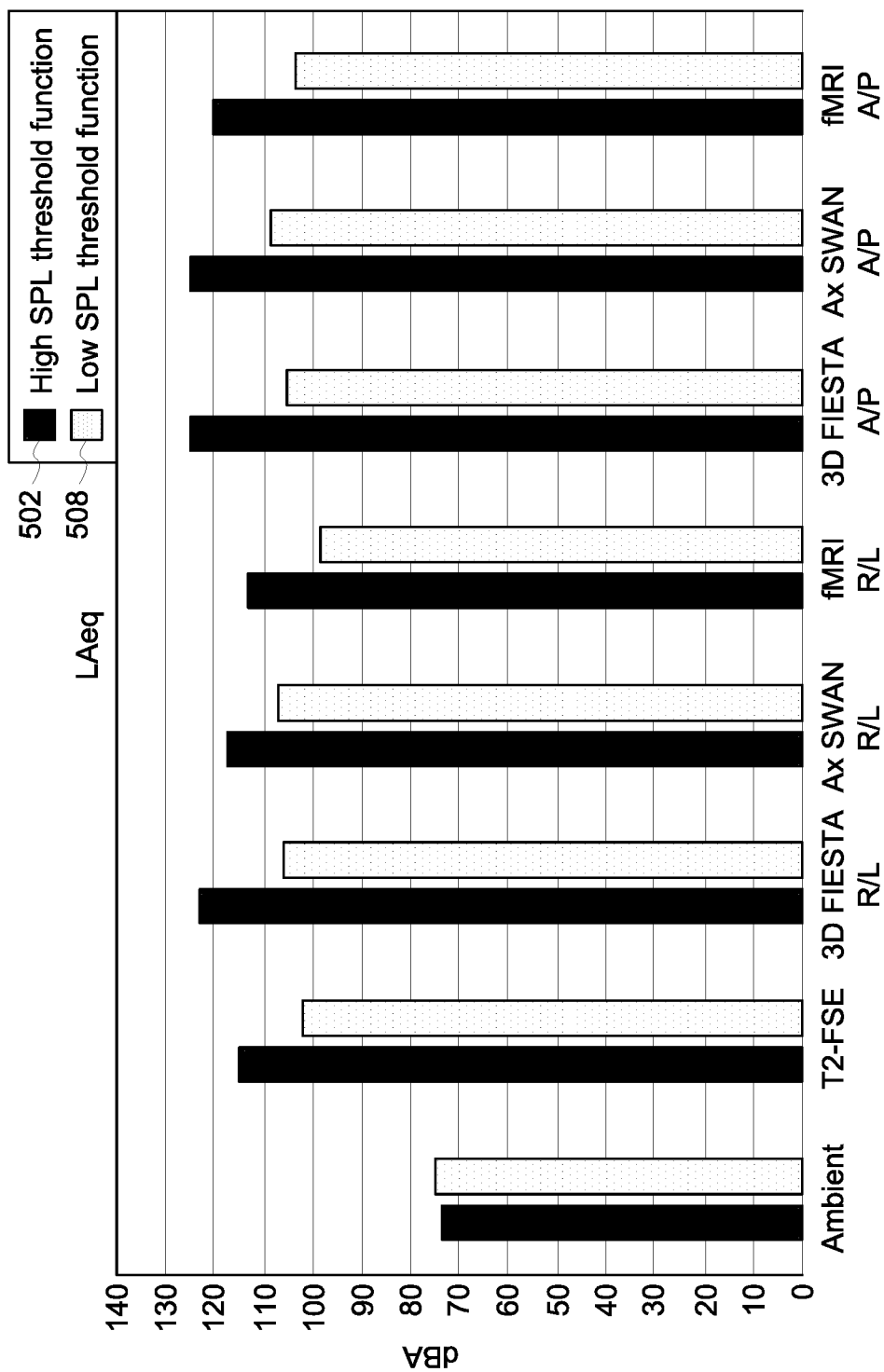
FIG. 6 is a plot of equivalent continuous acoustic noise levels of pulse sequences derived using the method shown in FIG. 4.
Figure 7:
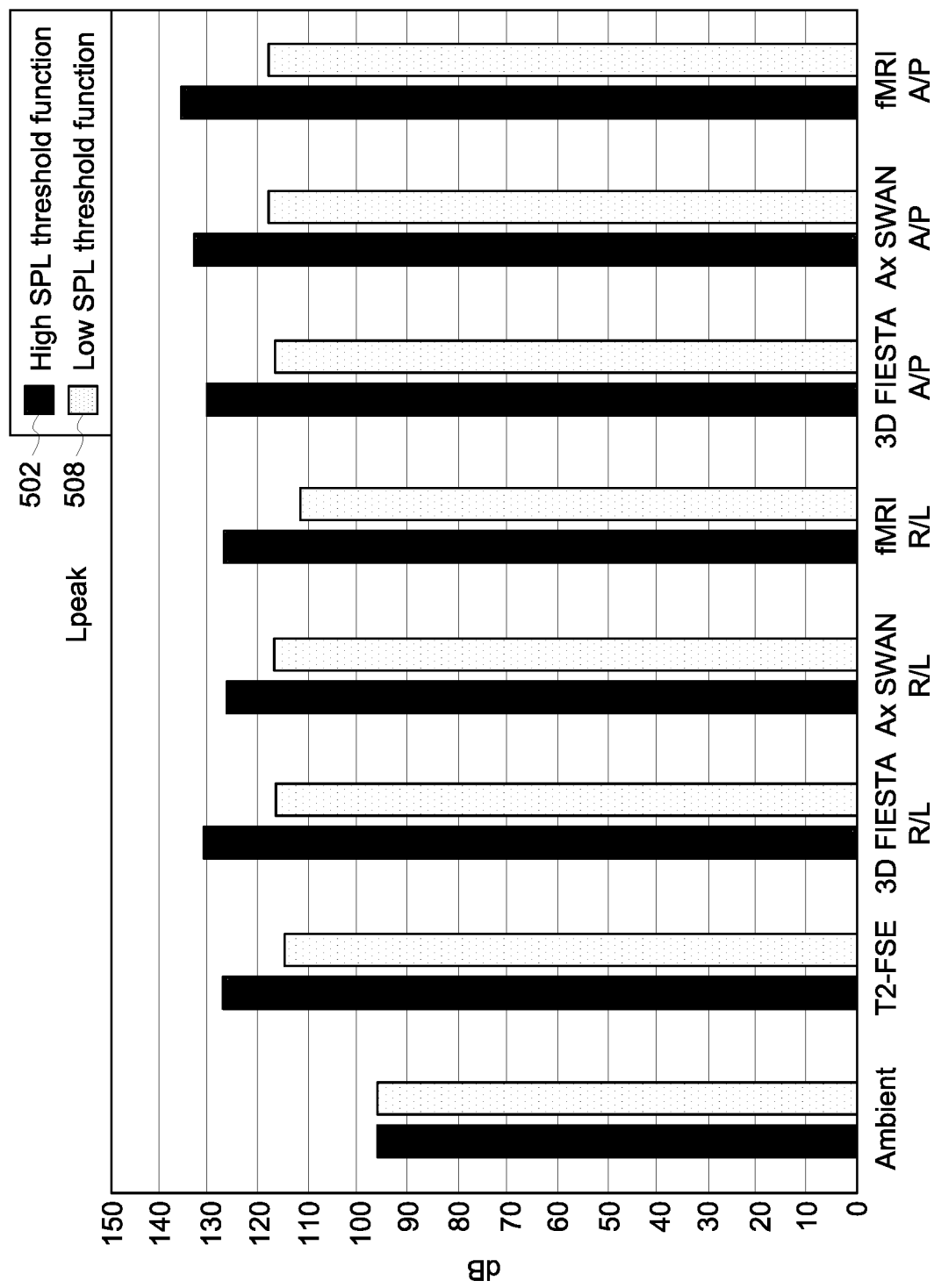
FIG. 7 is a plot of peak acoustic noise levels of pulse sequences derived using the method shown in FIG. 4.

In some operations, the pulse sequence threshold function 502-508 is selected or determined based on a selected pulse sequence and a desired acoustic noise reduction or acoustic noise level threshold. For example, as shown in FIGS. 6 and 7, different pulse sequences that are modified based on the same threshold functions may have different acoustic noise levels. After a pulse sequence for use in a scanning application is selected, the computing device or an operator may select or generate a pulse sequence threshold function that will modify the selected pulse sequence according to a desired acoustic noise level. As an example, referring to FIG. 6, where an Axial Swan A/P sequence is selected and the desired acoustic noise threshold is 110 dBA LAeq, the low sound pressure level (SPL) threshold function 508 is selected. In contrast, where the fMRI A/P sequence is selected for the same acoustic noise threshold, a different pulse sequence threshold function 502-506 may be used or a new pulse sequence threshold function may be generated by selecting a different slope coefficient (a) and/or intercept coefficient (b) to achieve the desired acoustic noise threshold of 110 dBA LAeq. As indicated, with a global setting, different pulse sequences achieve different levels of acoustic noise. The threshold curves, through the setting of the slope coefficient (a) and intercept coefficient (b) parameters, can be set individually for different pulse sequences such that a uniform sound pressure level can be achieved for all pulse sequences. Global threshold settings will end up derating the performance of all pulse sequences. The methods of the present disclosure achieve the same level of sound pressure level/acoustic noise that is uniform, such that not all the pulse sequences are adversely impacted by the threshold curve settings. As an example, with axial 3D FIESTA (with R/L readout), the sound pressure level is about 120 dBA (FIG. 6). The fMRI sequence with R/L readout is at about 110 dBA at the same threshold function 502. If there is a need to maintain a 110 dBA sound pressure level across all pulse sequences, then only 3D FIESTA would be subject to a different threshold function curve, with different slope coefficient (a) and intercept coefficient (b) values to achieve the same sound pressure level as the fMRI pulse sequence (which would be unmodified).

The slope coefficient (a) and an intercept coefficient (b) may be determined by measuring acoustic noise levels of the MRI system for a plurality of pulses having different gradient amplitudes ($G_p$) and rise times (t). The slope coefficient (a) and an intercept coefficient (b) may be determined empirically. For example, the first slope coefficient (a) may be between 1 and 300 T/m/s and the first intercept coefficient (b) may be between 0.001 and 1.0 T/m. Different slope coefficient (a) and intercept coefficient (b) values may be selected to provide a plurality of pulse sequence threshold functions 502-508, that each correspond to different acoustic noise thresholds of the MRI system 10. Moreover, since the rise time (t) of a gradient pulse is equal to the gradient amplitude ($G_p$) divided by the slew rate (SR), Eq. 3 may be rewritten to provide the threshold amplitude as a function of the slew rate, as in Eq. (4) below:

$$G_p(SR)=b*SR/(SR-a) \qquad (4).$$

Eq. (4) provides that the intercept coefficient (b) multiplied by the slew rate (SR) divided by the slew rate (SR) minus the slope coefficient (a) is equal to the threshold gradient amplitude for a given slew rate $G_p(SR)$. By inputting a range of slew rate values in the pulse sequence threshold function of Eq. (4), the threshold curves 502-508 may be produced which indicate a threshold gradient amplitude for each slew rate. Eq. (4) may also be rewritten to provide the threshold slew rate as a function of the amplitude, as in Eq. (5) below:

$$SR(GP)=G_p*a/(G_p-b) \qquad (5).$$

Eq. (5) provides that the gradient amplitude ($G_p$) multiplied by the slope coefficient and divided by the gradient amplitude ($G_p$) minus the intercept coefficient (b) is equal to the threshold slew rate for a given gradient amplitude SR ($G_p$).

Referring to FIG. 5, the four pulse sequence threshold curves 502-508 are generated from Eq. (4), provided above, with each pulse sequence threshold function having a different slope coefficient a and intercept coefficient b. The first or "high SPL" pulse sequence threshold function 502 has a slope coefficient a of 161 and an intercept coefficient b of 0.061 T/m. A second pulse sequence threshold function 504 has a slope coefficient a of 123 T/m/s and an intercept coefficient b of 0.047 T/m. A third pulse sequence threshold function 506 has a slope coefficient a of 92 T/m/s and an intercept coefficient b of 0.035 T/m. A fourth or "low SPL" pulse sequence threshold function 508 has a slope coefficient a of 72 T/m/s and an intercept coefficient b of 0.028 T/m. Each of the threshold curves 502-508 shown in FIG. 5 are associated with a different acoustic noise threshold due to the different values of the slope coefficients a and intercept coefficients b. For example, the high pulse sequence threshold function 502 provides the greatest acoustic noise threshold level (i.e., resulting in less acoustic noise reduction)

while the low pulse sequence threshold function 508 provides the lowest acoustic noise threshold level (i.e., resulting in greater acoustic noise reduction).

In some embodiments, the method 400 further includes selecting a pulse sequence threshold function 502-508 from the plurality of threshold sequence threshold functions 502-508 based on a desired acoustic noise threshold of a particular MRI application. For example, during use, an operator may select the high pulse sequence threshold function 502 for use during general MRI applications, while the low pulse sequence threshold function 508 may be used in MRI applications where lower acoustic noise levels are more desirable, such as during a sleep study. For example, during a sleep study, the acoustic noise threshold may be between 70-80 dB, to run the scanner quiet enough to comfortably allow the patient to sleep in the machine. In one embodiment, an operator at workstation 12 inputs a desired acoustic noise level threshold and one of processor 18 or pulse sequence server 20 determines a pulse sequence threshold function and/or values of the slope coefficient a and intercept coefficient b based on the desired acoustic noise level threshold.

Referring once again to FIG. 4, the method 400 further includes, for each gradient pulse 210 in the pulse sequence, the gradient pulse 210 is analyzed 405. Analyzing 405 includes determining 406 an amplitude of the gradient pulse and a slew rate of the gradient pulse 210. In the example embodiment, the amplitude and/or slew rate of the gradient pulse are be determined by retrieving stored amplitude and/or slew rate values associated with the particular pulse sequence. For example, waveform parameters for each gradient pulse of the fast spin echo sequence 202 (shown in FIG. 2) are stored on a memory of the computing device and the computing device retrieves the waveform parameters from the memory. Alternatively, one of the pulse sequence server 20 or the workstation 12 may be programmed to estimate an expected amplitude and slew rate of the pulse sequence based on the pulse sequence instructions received at step 402. In the example shown in FIG. 5, the amplitude of the gradient pulse 210 in the gradient pulse sequence is determined to be 160 mT/m and the slew rate is 400 T/m/s.

The method 400 further includes determining 408 a threshold amplitude corresponding to the determined slew rate and determining a threshold slew rate corresponding to the determined amplitude. In particular, Eq. (4), provided above, is used to determine the threshold amplitude based on the determined slew rate (400 T/m/s) of the gradient pulse 210 and Eq. (5) is used to determine the threshold slew rate based on the determined amplitude of 160 mT/m for the gradient pulse 210. Referring to FIG. 5, in the example embodiment, the threshold slew rate for the determined amplitude is determined to be about 260 T/m/s at a first point 510 on the first threshold curve 502 and the threshold amplitude for the determined slew rate is determined to be about 102 mT/m at a second point 512 on the first threshold curve 502.

The method 400 further includes comparing 410 the determined amplitude to the threshold amplitude and comparing the determined slew rate to the threshold slew rate. In the example described with respect to FIG. 5, the gradient amplitude of 160 mT/m of the gradient pulse 210 is determined to be greater than the threshold amplitude of 102 mT/m and the slew rate of 400 T/m/s of the gradient pulse 210 is determined to be greater than the threshold slew rate of 260 T/m/s. Therefore, the gradient pulse 210 is determined to be above the first threshold curve 502, indicating that it will generate an acoustic noise level that is greater than the desired acoustic noise level associated with the first threshold curve 502.

The method 400 further includes modifying 412 the gradient pulse, if the determined amplitude exceeds the threshold amplitude or the determined slew rate exceeds the threshold slew rate, by adjusting at least one of the amplitude and the slew rate to an amplitude and a slew rate as defined by the pulse sequence threshold function. In particular, in the example embodiment, in response to determining that the gradient pulse 210 exceeds the first threshold curve 502, at least one of the amplitude and the slew rate of the gradient pulse 210 is modified to be on or below the first threshold curve 502. For example, in a first operation, the amplitude of the gradient pulse 210 is not changed and the slew rate is reduced to the threshold slew rate of 260 T/m/s. In the first operation, the gradient pulse 210 is modified to be at the first point 510 on the first threshold curve 502. In a second, alternative operation, the slew rate is not changed and the amplitude of the gradient pulse 210 is reduced to the threshold amplitude of 102 mT/m. While in the second operation, the gradient pulse 210 is modified to be at the second point 512 on the first threshold curve 502.

In a third operation, both the amplitude and the slew rate of the gradient pulse 210 are adjusted such that modified gradient pulse sequence is located along or near the first threshold curve 502 between the first point 510 and the second point 512. For example, in one embodiment, the amplitude is first adjusted to an amplitude selected in a range between the determined amplitude (160 mT/m) and the amplitude threshold (102 mT/m), such as 140 mT/m for example. The slew rate is then adjusted to a slew rate that corresponds to the adjusted amplitude (140 mT/m) as determined by the pulse sequence threshold function 502, e.g., about 285 T/m/s. Alternatively, in another embodiment, the slew rate is first adjusted to a slew rate between the slew rate of the gradient pulse 210 (400 T/m/s) and the slew rate threshold (260 T/m/s). The gradient amplitude is then adjusted to a gradient amplitude that corresponds to the adjusted slew rate as determined by the pulse sequence threshold function 502. In some embodiments, an optimized adjustment of the slew rate and the gradient amplitude may be determined based on the pulse sequence threshold function and one or more operating parameters of the MRI system. For example, and without limitation, in some such embodiments, the pulse sequence server 20 (shown in FIG. 1) may model the effects of all amplitude and slew rate combinations along the pulse sequence threshold function between the first point 510 and the second point 512 on one or more operating parameters of the MRI system, such as image quality. A modified slew rate and gradient amplitude combination may then be selected, based on the modeling, to provide a modified gradient pulse that is optimized based on the one or more operating parameters.

In some embodiments, the method 400 may further include determining whether to perform the first operation (in which only the slew rate is modified), the second operation (in which only the amplitude is modified), or the third operation (in which both the amplitude and the slew rate are modified). In particular, in some such methods, the determination is based on the MRI application being performed. For example, in diffusion-weighted imaging, it is more beneficial to maintain the gradient amplitude of the diffusion encoding gradients than the slew rate, to limit the effects of diffusion encoding gradients on TE and TR, especially at high b values. In functional MRI, to limit geometric distortion, it is more beneficial to maintain the slew rate of the EPI readout trapezoid gradient pulse train than the gradient amplitude. In another application such as phase contrast imaging, it is desired to have the first gradient moment minimized in time with minimal eddy current effects, in which case the time and amplitude of the gradient pulses are balanced in order to secure both minimal eddy currents as well as a more compact total pulse width or waveform time. For such applications, the computing device may automatically determine whether to perform the first operation, the second operation, or the third operation based on the MRI application. In further embodiments, the computing device may be configured to receive a user-input command indicating which operation should be performed.

In alternative operations, one or more gradient pulses 210 in the pulse sequence 202 are compared to the pulse sequence threshold function and the remaining gradient pulses 210 may be modified based on the modifications to the analyzed gradient pulse 210. For example, a gradient pulse in the pulse sequence that has the highest gradient amplitude among the gradient pulses of the pulse sequence is analyzed using the pulse sequence threshold function to derive a slew rate while the highest gradient amplitude remains the same. The derived slew rate is applied to all of the gradient pulses in the pulse sequence. Alternatively, a pair of a slew rate and a new highest gradient amplitude are derived for the gradient pulse having the highest amplitude. The derived slew rate is applied to the rest of the gradient pulses. Gradient pulses having amplitudes greater than the new highest gradient amplitude are modified using the threshold function, while the remaining gradient pulses keep the original amplitudes. This strategy takes into account that a gradient pulse having a higher gradient amplitude and faster slew rate contributes to the acoustic noise more than a gradient pulse having a lower gradient amplitude and slower slew rate. Alternatively, a transfer function in terms of the gradient pulse waveform shape, rise/fall times, and amplitudes can be characterized in terms of the slope coefficient a and intercept coefficient b values and the corresponding sound pressure level. In such a case, each gradient pulse or waveform in the pulse sequence can be individually adjusted to achieve the desired sound pressure level.

Referring to FIG. 4, after the gradient pulse 210 is modified, analyzing 405 is repeated for each gradient pulse 210 in the pulse sequence 202. After each gradient pulse in the pulse sequence 202 has been compared to the pulse sequence threshold function 502, and modified if necessary, the method 400 may further include causing 414 the modified gradient pulse sequence to be generated by the MRI system 10.

FIGS. 6 and 7 show results of acoustic noise tests using derated pulse sequences according to the methods described herein. In particular, FIG. 6 is a plot of A-weighted equivalent continuous acoustic noise levels (LAeq) generated using pulse sequences derived from the method shown in FIG. 4. FIG. 7 is a plot of peak unweighted (Lpeak) acoustic noise levels generated using pulse sequences derived from the method shown in FIG. 4. The tests were performed after derating gradient pulses of each of the example pulse sequences based on the high pulse sequence threshold function 502 and the low pulse sequence threshold function 508 (shown in FIG. 5). The pulse sequences were derated by making adjustments to the slew rates and gradient amplitudes of the gradient pulses in the pulse sequence, according to the third operation described above. Acoustic measurements were made using a sound analyzer. The microphone was placed at the imaging isocenter of the MRI system, perpendicular to the patient axis. As shown in FIG. 6, the A-weighted, equivalent continuous sound level ($L_{Aeq}$) was recorded in A-weighted decibels (dBA). As shown in FIG. 7, the unweighted peak sound level ($L_{peak}$) was recorded in decibels (dB). Derating of the gradient pulses according to the low pulse sequence threshold function 508 resulted in an average 12 dBA and maximal 18.5 dBA reduction in $L_{Aeq}$ relative to the high pulse sequence threshold function 502. Similar results were seen for $L_{peak}$, with an average 11.5 dB and maximum 16 dB reduction.

Figure 8:
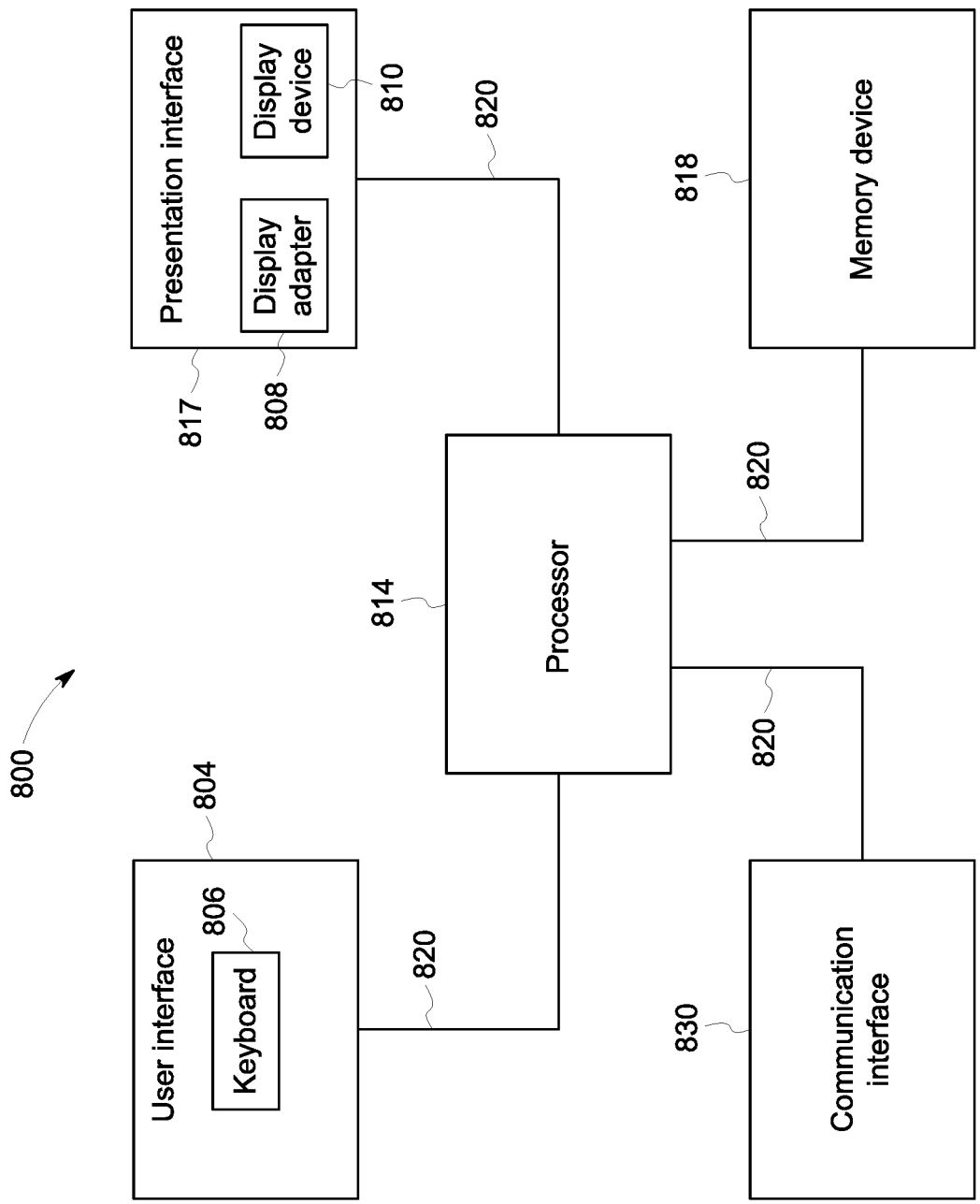
FIG. 8 is a block diagram of an exemplary computing device.

The workstation 12 and the computing device described herein may be any suitable computing device 800 and software implemented therein. FIG. 8 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 that presents information, such as input events and/or validation results, to the user. The presentation interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the presentation interface 817 may include an audio output device (e.g., an audio adapter and/or a speaker) and/or a printer.

The computing device 800 also includes a processor 814 and a memory device 818. The processor 814 is coupled to the user interface 804, the presentation interface 817, and the memory device 818 via a system bus 820. In the exemplary embodiment, the processor 814 communicates with the user, such as by prompting the user via the presentation interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the disclosure described and/or illustrated herein. The order of execution or performance of the operations in embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

At least one technical effect of the systems and methods described herein includes (a) reduction of acoustic noise from pulse sequences; (b) improved MR imaging performance; (c) reduction of Eddy currents in MRI system; and (d) reduced peripheral nerve stimulation.

Exemplary embodiments of systems and methods of generating pulse sequences in magnetic resonance imaging (MRI) systems are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A pulse sequence generation computing device for a magnetic resonance imaging (MRI) system, the pulse sequence generation computing device comprising at least one processor in communication with at least one memory device, and the at least one processor programmed to:
    receive a pulse sequence including a plurality of gradient pulses;
    provide a pulse sequence threshold function that corresponds to an acoustic noise reduction level of acoustic noise produced by switching gradients in the MRI system, the pulse sequence threshold function indicating a plurality of threshold amplitudes of the gradient pulses and a plurality of threshold slew rates of the gradient pulses each associated with one of the plurality of threshold amplitudes;
    for at least one gradient pulse in the pulse sequence,
        determine an amplitude of the gradient pulse and a slew rate of the gradient pulse;
        determine a threshold amplitude corresponding to the determined slew rate and a threshold slew rate corresponding to the determined amplitude;
        compare the determined amplitude to the threshold amplitude and the determined slew rate to the threshold slew rate; and
        if the determined amplitude exceeds the amplitude threshold or the determined slew rate exceeds the slew rate threshold, the at least one processor configured to modify the gradient pulse by adjusting at least one of the amplitude and the slew rate of the gradient pulse to an amplitude and a slew rate as defined by the pulse sequence threshold function.

2. A pulse sequence generation computing device for a magnetic resonance imaging (MRI) system, the pulse sequence generation computing device comprising at least one processor in communication with at least one memory device, and the at least one processor programmed to:
    receive a pulse sequence including a plurality of gradient pulses;
    provide a pulse sequence threshold function that corresponds to an acoustic noise reduction level of acoustic noise produced by switching gradients in the MRI system, the pulse sequence threshold function indicating a plurality of threshold amplitudes of the gradient pulses and a plurality of threshold slew rates of the gradient pulses each associated with one of the plurality of threshold amplitudes;
    for each gradient pulse in the pulse sequence,
        determine an amplitude of the gradient pulse and a slew rate of the gradient pulse;
        determine a threshold amplitude corresponding to the determined slew rate and a threshold slew rate corresponding to the determined amplitude;
        compare the determined amplitude to the threshold amplitude and the determined slew rate to the threshold slew rate; and
        if the determined amplitude exceeds the amplitude threshold or the determined slew rate exceeds the slew rate threshold, the at least one processor configured to modify the gradient pulse by adjusting at least one of the amplitude and the slew rate of the gradient pulse to an amplitude and a slew rate as defined by the pulse sequence threshold function.

3. The computing device of claim 2, wherein the at least one processor is further configured to modify the gradient pulse by:
    maintaining the amplitude at the determined amplitude; and adjusting the slew rate to be less than or equal to the threshold slew rate corresponding to the determined amplitude.

4. The computing device of claim 2, wherein the at least one processor is further configured to modify the gradient pulse by:
    maintaining the slew rate at the determined slew rate; and adjusting the amplitude to be less than or equal to the threshold amplitude corresponding to the determined slew rate.

5. The computing device of claim 2, wherein the least one processor is further configured to modify each gradient pulse in the pulse sequence by:
   adjusting the amplitude to an amplitude selected in a range between the determined amplitude and the threshold amplitude; and
   adjusting the slew rate to a slew rate corresponding to the adjusted amplitude and determined by the pulse sequence threshold function.

6. The computing device of claim 2, wherein the least one processor is further configured to modify each gradient pulse in the pulse sequence by:
   adjusting the slew rate to a slew rate selected between the determined slew rate; and
   adjusting the amplitude to an amplitude corresponding to the adjusted slew rate and determined by the pulse sequence threshold function.

7. The computing device of claim 2, wherein the threshold amplitude is provided by the pulse sequence threshold function as a linear function of a rise time of the gradient pulse, and wherein the at least one processor is further configured to:
   select a first acoustic noise threshold of the MRI system; and
   determine a first slope coefficient a and a first intercept coefficient b of the pulse sequence threshold function based on the selected first acoustic noise threshold.

8. The computing device of claim 7, wherein the first slope coefficient a is between 1 and 300 Telsa per meter per second.

9. The computing device of claim 7, wherein the first intercept coefficient b is between 0.001 and 1.0 Telsa per meter.

10. The computing device of claim 7, wherein the first acoustic noise threshold is selected based on a first MRI application, and wherein the processor is further programmed to determine a second slope coefficient a and a second intercept coefficient b associated with a second acoustic noise threshold for a second MRI application.

11. The computing device of claim 10, wherein the second MRI application is a sleep study, the second acoustic noise threshold is less than the first acoustic noise threshold, and wherein the second slope coefficient a and a second intercept coefficient b are each less than the first slope coefficient a and the first intercept coefficient b, respectively, and wherein the second acoustic noise threshold is between 70 and 80 decibels.

12. The computing device of claim 2, wherein the at least one processor is further configured to cause the modified pulse sequence to be generated by the MRI system.

13. A computer implemented method of generating a pulse sequence in a magnetic resonance imaging (MRI) system, comprising:
   receiving a pulse sequence including a plurality of gradient pulses;
   providing a pulse sequence threshold function that corresponds to an acoustic noise reduction level of acoustic noise produced by switching gradients in the MRI system, the pulse sequence threshold function indicating a plurality of threshold amplitudes of the gradient pulses and a plurality of threshold slew rates of the gradient pulses each associated with one of the plurality of threshold amplitudes;
   for each gradient pulse in the pulse sequence,
      determining an amplitude of the gradient pulse and a slew rate of the gradient pulse;
      determining a threshold amplitude corresponding to the determined slew rate and a threshold slew rate corresponding to the determined amplitude;
      comparing the determined amplitude to the threshold amplitude and the determined slew rate to the threshold slew rate; and
      modifying, if the determined amplitude exceeds the amplitude threshold or the determined slew rate exceeds the slew rate threshold, the gradient pulse by adjusting at least one of the amplitude and the slew rate of the gradient pulse to an amplitude and a slew rate as defined by the pulse sequence threshold function; and
   causing the modified pulse sequence to be generated by the MRI system.

14. The method of claim 13, wherein modifying the gradient pulse further comprises:
   maintaining the amplitude at the determined amplitude; and
   adjusting the slew rate to be less than or equal to the threshold slew rate corresponding to the determined amplitude.

15. The method of claim 13, wherein modifying the gradient pulse further comprises:
   maintaining the slew rate at the determined slew rate; and
   adjusting the amplitude to be less than or equal to the threshold amplitude corresponding to the determined slew rate.

16. The method of claim 13, wherein modifying the gradient pulse further comprises:
   adjusting the amplitude to an amplitude selected in a range between the determined amplitude and the threshold amplitude; and
   adjusting the slew rate to a slew rate corresponding to the adjusted amplitude and determined by the pulse sequence threshold function.

17. The method of claim 13, wherein modifying the gradient pulse further comprises:
   adjusting the slew rate to a slew rate selected between the determined slew rate; and
   adjusting the amplitude to an amplitude corresponding to the adjusted slew rate and determined by the pulse sequence threshold function.

18. The method of claim 13, wherein the threshold amplitude is provided by the pulse sequence threshold function as a linear function of a rise time of the gradient pulse, and wherein the method further comprises:
   selecting a first acoustic noise threshold of the MRI system; and
   determining a first slope coefficient a and a first intercept coefficient b of the pulse sequence threshold function based on the selected first acoustic noise threshold.

19. The method of claim 18, wherein the first slope coefficient a is between 50 and 200 Telsa per meter per second.

20. The method of claim 18, wherein the first intercept coefficient b is between .01 and .1 Telsa per meter.

* * * * *